(12) United States Patent
Mueller et al.

(10) Patent No.: US 9,472,542 B2
(45) Date of Patent: Oct. 18, 2016

(54) DRAM ARRAYS, SEMICONDUCTOR CONSTRUCTIONS AND DRAM ARRAY LAYOUTS

(71) Applicant: Micron Technology, Inc., Boise, ID (US)

(72) Inventors: Wolfgang Mueller, Garden City, ID (US); Sanh D. Tang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 357 days.

(21) Appl. No.: 14/024,347

(22) Filed: Sep. 11, 2013

(65) Prior Publication Data

US 2015/0069482 A1   Mar. 12, 2015

(51) Int. Cl.
| | | |
|---|---|---|
| H01L 29/78 | (2006.01) |
| H01L 21/336 | (2006.01) |
| H01L 29/94 | (2006.01) |
| H01L 27/108 | (2006.01) |
| H01L 27/02 | (2006.01) |
| H01L 29/423 | (2006.01) |

(52) U.S. Cl.
CPC ..... *H01L 27/0207* (2013.01); *H01L 27/10888* (2013.01); *H01L 29/4236* (2013.01); *H01L 27/10823* (2013.01); *H01L 27/10876* (2013.01); *H01L 27/10891* (2013.01); *H01L 29/78* (2013.01)

(58) Field of Classification Search
CPC .............. H01L 27/0207; H01L 27/10888; H01L 29/4236; H01L 27/10823; H01L 27/10876; H01L 27/10891; H01L 29/78
USPC ................................................. 257/291–301
See application file for complete search history.

(56) References Cited

U.S. PATENT DOCUMENTS

| | | | |
|---|---|---|---|
| 6,396,096 B1 * | 5/2002 | Park .................. | H01L 27/10808 257/296 |
| 6,660,581 B1 * | 12/2003 | Yang ................. | H01L 27/10841 257/E21.396 |
| 2005/0077560 A1 * | 4/2005 | Shiratake .......... | H01L 27/10888 257/296 |
| 2005/0194597 A1 * | 9/2005 | Seo ................... | H01L 27/10823 257/71 |
| 2007/0048942 A1 * | 3/2007 | Hanson ............. | H01L 21/26513 438/268 |
| 2007/0145450 A1 * | 6/2007 | Wang ................. | H01L 27/0207 257/296 |
| 2008/0061346 A1 * | 3/2008 | Tang .................. | H01L 29/7841 257/314 |
| 2008/0087950 A1 * | 4/2008 | Ueda ................. | H01L 21/31116 257/330 |
| 2008/0283957 A1 * | 11/2008 | Kang ................ | H01L 21/76897 257/499 |
| 2014/0063891 A1 * | 3/2014 | Asao ..................... | G11C 5/063 365/66 |

* cited by examiner

*Primary Examiner* — Marc Armand
*Assistant Examiner* — Nelson Garces
(74) *Attorney, Agent, or Firm* — Wells St. John P.S.

(57) ABSTRACT

Some embodiments include a DRAM array layout. Wordlines extend along a first direction, and bitlines extend along a second direction that crosses the first direction. Cell active material structures are at intersections of the wordlines and bitlines. The cell active material structures have a first side coupled to a bitline and a second side coupled to a capacitor. The second side is on an opposite side of a wordline passing through a cell active material structure relative to the first side. Each cell active material structure has a connection to a bitline which is not shared with any other cell active material structures. Some embodiments include DRAM arrays and semiconductor constructions.

5 Claims, 4 Drawing Sheets

DRAM ARRAYS, SEMICONDUCTOR CONSTRUCTIONS AND DRAM ARRAY LAYOUTS

TECHNICAL FIELD

DRAM arrays, semiconductor constructions and DRAM array layouts.

BACKGROUND

Dynamic random access memory (DRAM) may be utilized for storing information in programmable systems. DRAM may be fabricated as an array comprising individual memory cells containing a transistor in combination with a charge-storage device (such as, for example, a capacitor). Bitlines and wordlines may extend across the array, and may be utilized for accessing individual memory cells.

A continuing goal is to increase integration, and accordingly to increase packing density of DRAM and other circuitry. A problem encountered as DRAM is packed to higher density is that crosstalk between adjacent wordlines (sometimes referred to as a row-hammer) becomes increasingly problematic.

It is desired to develop new architectures suitable for fabrication of highly-integrated DRAM. It is further desired that such architectures alleviate or prevent problematic crosstalk between adjacent wordlines.

DETAILED DESCRIPTION OF THE ILLUSTRATED EMBODIMENTS

Some embodiments include new architectures suitable for fabrication of DRAM. Example embodiments are described with reference to FIGS. 1-4.

Figure 1:
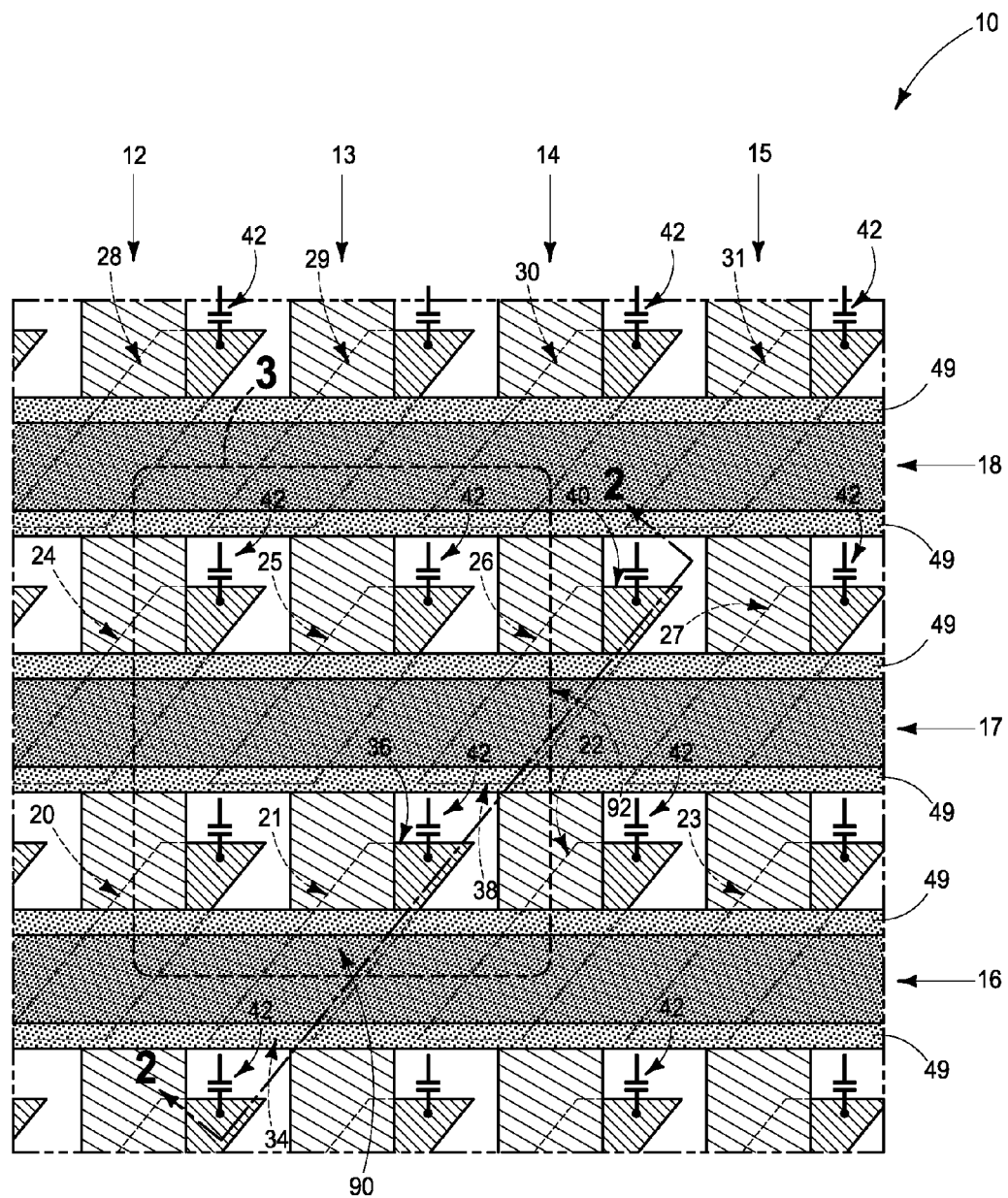
FIG. 1 is a diagrammatic view of an example embodiment DRAM array layout.

Referring to FIG. 1, a layout of an integrated memory array 10 is diagrammatically illustrated. In some embodiments, such memory array may correspond to a DRAM array.

The memory array comprises wordlines 12-15 extending along a first direction, and comprises bitlines 16-18 extending along a second direction which crosses (i.e., intersects) the first direction. In the shown embodiment, the wordlines and bitlines are substantially orthogonal to one another; with the term "substantially orthogonal" meaning that the wordlines and bitlines are orthogonal to within reasonable tolerances of fabrication and measurement.

Cell active material structures 20-31 are at intersections of the wordlines and bitlines. In the illustrated embodiment, the cell active material structures are substantially parallelograms; with the term "substantially parallelograms" indicating that the structures are parallelograms to within reasonable tolerances.

The wordlines 12-15 pass through the cell active material structures 20-31. Each of the cell active material structures has a first side on one side of a wordline passing therethrough, and a second side on the other side of such wordline. For instance, the structure 21 is shown to have a first side 34 on one side of the wordline 13 passing therethrough, and to have a second side 36 on an opposite side of the wordline from the first side. Similarly, the structure 26 is shown to have a first side 38 on one side of the wordline 14 passing therethrough, and to have a second side 40 on the opposite side of such wordline.

In the shown embodiment, the first sides of the cell active material structures 20-31 are connected to the bitlines 16-18 (for instance, first side 34 of cell active material structure 21 is connected to bitline 16, and first side 38 of cell active material structure 26 is connected to bitline 17). The second sides are connected to charge storage devices in the shown embodiment, and specifically are diagrammatically shown as being connected to capacitors 42 (only some of which are labeled). Although capacitors are utilized to illustrate the charge storage devices, it is to be understood that the charge storage devices may be any components which reversibly store charge in a manner suitable to behave as a memory bit.

Notably, each of the cell active material structures has a connection to a bitline which is not shared with any other cell active material structure. In contrast, conventional DRAM constructions typically share a bitline connection between two adjacent memory cells.

The layout of FIG. 1 comprises dielectric material 49 under the bitlines 16-18. Such dielectric material spaces the bitlines from upper surfaces of the cell active structures 20-31. The dielectric material may comprise any suitable composition or combination of compositions; and in some embodiments may comprise, consist essentially of, or consist of one or both of silicon dioxide and silicon nitride.

The layout of FIG. 1 may be considered to comprise a unit cell corresponding to the smallest structure from which the entire layout may be built by repetition. Such unit cell may have dimensions of 2F×3F in some embodiments, where "F" is a minimum feature size. Accordingly, the unit cell may have an area of $6F^2$. The minimum feature size may be, for example, the minimum features size of a lithographic process utilized to fabricate a design from the layout of FIG. 1.

Figure 2:
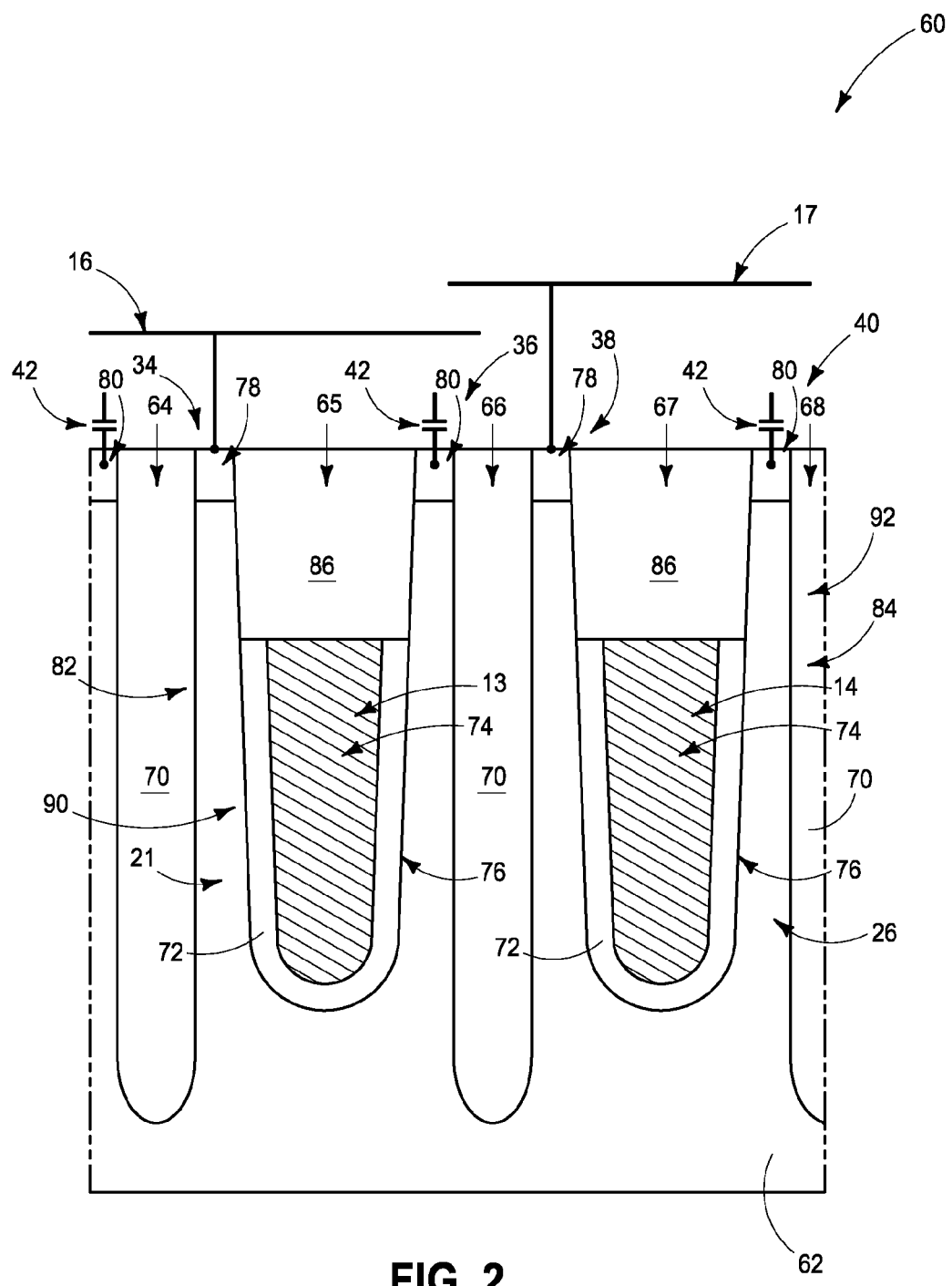
FIG. 2 is a diagrammatic cross-sectional view along the line 2-2 of FIG. 1, illustrating an example embodiment DRAM configuration.

Referring to FIG. 2, a DRAM array 60 is shown in cross-sectional side view. The DRAM array 60 is an example embodiment which may correspond to the layout of FIG. 1, and is shown along the line 2-2 of FIG. 1. The dielectric material 49 is not shown in FIG. 2 in order to simplify the drawing.

The DRAM array 60 comprises a base material 62. Such base material may be a semiconductor material, and in some embodiments may comprise, consist essentially of, or consist of monocrystalline silicon. In some embodiments, base material 62 may be comprised by a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, base material 62 may be comprised by a semiconductor substrate containing one or more materials associated with integrated circuit fabrication. Some of the materials may be under the shown region of base material 62 and/or may be laterally adjacent the shown region of base material 62; and may correspond to, for example, one or more of refractory metal materials, barrier materials, diffusion materials, insulator materials, etc.

Trenches 64-68 extend into base material 62. Such trenches are configured in a pattern of alternating deep trenches (64, 66 and 68) and shallow trenches (65 and 67). The terms "deep" and "shallow" are utilized to indicate that one set of trenches is deeper than another, and are not utilized to convey any quantitative description of the absolute depths of the trenches relative to conventional processing. Thus, the "shallow" trenches may or may not have depths which would be conventionally considered shallow, and similarly the "deep" trenches may or may not have depths which would be conventionally considered deep.

In some embodiments, the deep trenches (64, 66 and 68) may be deeper than the shallow trenches (65 and 67) by from about 300 Å to about 1000 Å. In some embodiments, an overall depth of the deep trenches may be from about 500 Å to about 10 microns, and an overall depth of the shallow trenches may be from about 200 Å to about 10 microns.

Electrically insulative material 70 is within the deep trenches (64, 66 and 68), and in the shown embodiment completely fills the deep trenches. Such electrically insulative material may comprise any suitable composition or combination of compositions; and in some embodiments may comprise, consist essentially of, or consist of one or both of silicon dioxide and silicon nitride. In the shown embodiment, material 70 is the only material within the deep trenches. The electrically insulative material 70 within the deep trenches may be sufficient by itself to prevent crosstalk between adjacent wordlines (e.g., may be sufficient to prevent the row-hammer problem of conventional DRAM array architectures). This is in contrast to some prior art DRAM configurations in which electrically biased conductive materials are provided between adjacent memory cells to enhance electrical isolation of memory cells in tightly-packed configurations.

The wordlines 13 and 14 are within shallow trenches 65 and 67, respectively. Such wordlines may be considered to be examples of electrically conductive lines that may be formed within the shallow trenches.

The wordlines are spaced from semiconductor material of base 62 by gate dielectric material 72. The gate dielectric material may comprise any suitable composition or combination of compositions; and in some embodiments may comprise, consist essentially of, or consist of silicon dioxide. The illustrated regions of the wordlines along the cross-section of FIG. 2 correspond to transistor gates 74.

The cell active areas 21 and 26 are shown to be trough-shaped (specifically, U-shaped in the shown embodiment), and to correspond to transistor active areas. Such transistor active areas comprise channel regions 76 adjacent the transistor gates, and comprise source/drain regions 78 and 80 at upper regions of the trough-shapes. The source/drain regions may be conductively-doped regions of semiconductor material of base 62. For instance, the source/drain regions may be n-type doped regions or p-type doped regions within a silicon-containing base 62 in some embodiments.

The channel region 76 may also be a doped region within semiconductor material of base 62, and specifically may be doped to obtain a desired threshold voltage.

The transistor gates 74, channel regions 76 and source/drain regions 78/80 together form a pair of transistors 82 and 84. The transistors 82 and 84 are illustrated relative to the cell active material structures 21 and 26, respectively. Similar transistors are at all of the other cell active material structures 20, 22-25 and 27-31 of FIG. 1, and accordingly the transistors 82 and 84 are representative of a plurality of transistors present within an example embodiment DRAM array. In some embodiments, the transistor gates 74, channel regions 76 and source/drain regions 78/80 may be considered as together comprising such plurality of transistors.

In the shown embodiment, electrically insulative material 86 is formed over wordlines 13 and 14 within the shallow trenches 65 and 67. Such electrically insulative material may comprise any suitable composition or combination of compositions; and in some embodiments may comprise, consist essentially of, or consist of one or both of silicon dioxide and silicon nitride.

In the shown embodiment, the wordlines 13 and 14 are illustrated adjacent the bottoms of the shallow trenches 65 and 67, and the semiconductor material of base 62 is shown to only partially surround the wordlines. In other embodiments, additional semiconductor material may be formed over the tops of the wordlines so that the transistor gates 74 are surrounded by semiconductor material along the cross-section of FIG. 2.

The wordlines 13 and 14 may be formed to any suitable thickness within the shallow trenches 65 and 67. In some embodiments, the wordlines and the gate dielectric material 72 together fill less than 80% of the overall depths of the shallow trenches.

The source/drain regions 78/80 may be considered to be paired source/drain regions associated with individual transistors. In the shown embodiment, one of the paired source/drain regions (specifically, source/drain region 78) is electrically coupled with a bitline (the bitlines 16 and 17 are diagrammatically illustrated in FIG. 2), and the other of the paired source/drain regions (specifically, source/drain region 80) is electrically coupled with a charge storage device (capacitors 42 are diagrammatically illustrated in FIG. 2 as example charge storage devices). In some embodiments, the bitlines may be electrically coupled to drain regions, and the charge storage devices may be electrically coupled to source regions.

The source/drain regions 78/80 of FIG. 2 correspond to the first and second sides of the cell active material structures 20-31 of FIG. 1. For instance, source/drain regions 78 and 80 of transistor 82 correspond to first and second sides 34 and 36 of the cell active material structure 21; and source/drain regions 78 and 80 of transistor 84 correspond to first and second sides 38 and 40 of cell active material structure 26.

A conventional strategy for obtaining tight packing across prior art DRAM arrays is to share source/drain regions amongst adjacent transistors so that the transistors share a bitline connection. In contrast, the DRAM array of FIG. 2 has no source/drain regions shared by adjacent transistors.

The configuration of FIG. 2 has wordlines 13 and 14 extending along a first direction (specifically, in and out of the page relative to the cross-section of FIG. 2) and has bitlines extending along a second direction which intersects the first direction (with the illustrated bitlines 16 and 17 extending horizontally along the plane of the cross-section of FIG. 2).

Memory cells within the configuration of FIG. 2 may be considered to comprise a transistor coupled with a charge storage device. Thus, transistor 82 and the associated charge storage device 42 coupled therewith may be considered to correspond to a first memory cell 90, and the transistor 84 together with the charge storage device 42 coupled therewith may be considered to correspond to a second memory cell 92. The wordlines 13 and 14 pass through the memory cells 90 and 92, respectively. In the shown embodiment, the memory cells 90 and 92 are directly adjacent one another, and separated from one another only by an intervening deep trench 66 filled with electrically insulative material 70. The adjacent memory cells 90 and 92 each have a unique bitline connection.

In some embodiments, the cell material structures 20-31 of FIG. 1 may be considered to correspond to memory cell active areas. Accordingly, the regions 21 and 26 of FIG. 2 may be considered to correspond to memory cell active areas that are between the trenches 64, 66 and 68, and that extend at least partially around the transistor gates 74.

The layout of FIG. 1 shows that memory cells 90 and 92 are representative of a large number of memory cells formed within a DRAM array. Specifically, memory cells 90 and 92 are within cell active material structures 21 and 26, respectively; and similar memory cells would be within the other cell active material structures of FIG. 1 (specifically, structures 20, 22-25 and 27-31; although the other memory cells are not labeled). The structure 26 comprising memory cell 92 is directly adjacent memory cells within active areas 25, 30, 31, 27, 22, 21 and 20, and does not share a bitline connection with any of such adjacent memory cells. Instead, all of the memory cells within the DRAM array have unique bitline connections.

The embodiment of FIG. 2 shows the bitlines 16 and 17 over the wordlines 13 and 14. In other embodiments, the bitlines may be under the wordlines.

In some embodiments, the bitlines 16 and 17 may be electrically coupled to source/drain regions 78 through slots provided in electrically insulative material (not shown) above the source/drain regions. Such slots may be narrowed with spacers comprising silicon dioxide and/or silicon nitride prior to providing electrical conductive material (for instance, conductively-doped polysilicon) within the slots, which can enable the bitline contacts to be scaled to high levels of integration.

Figure 3:
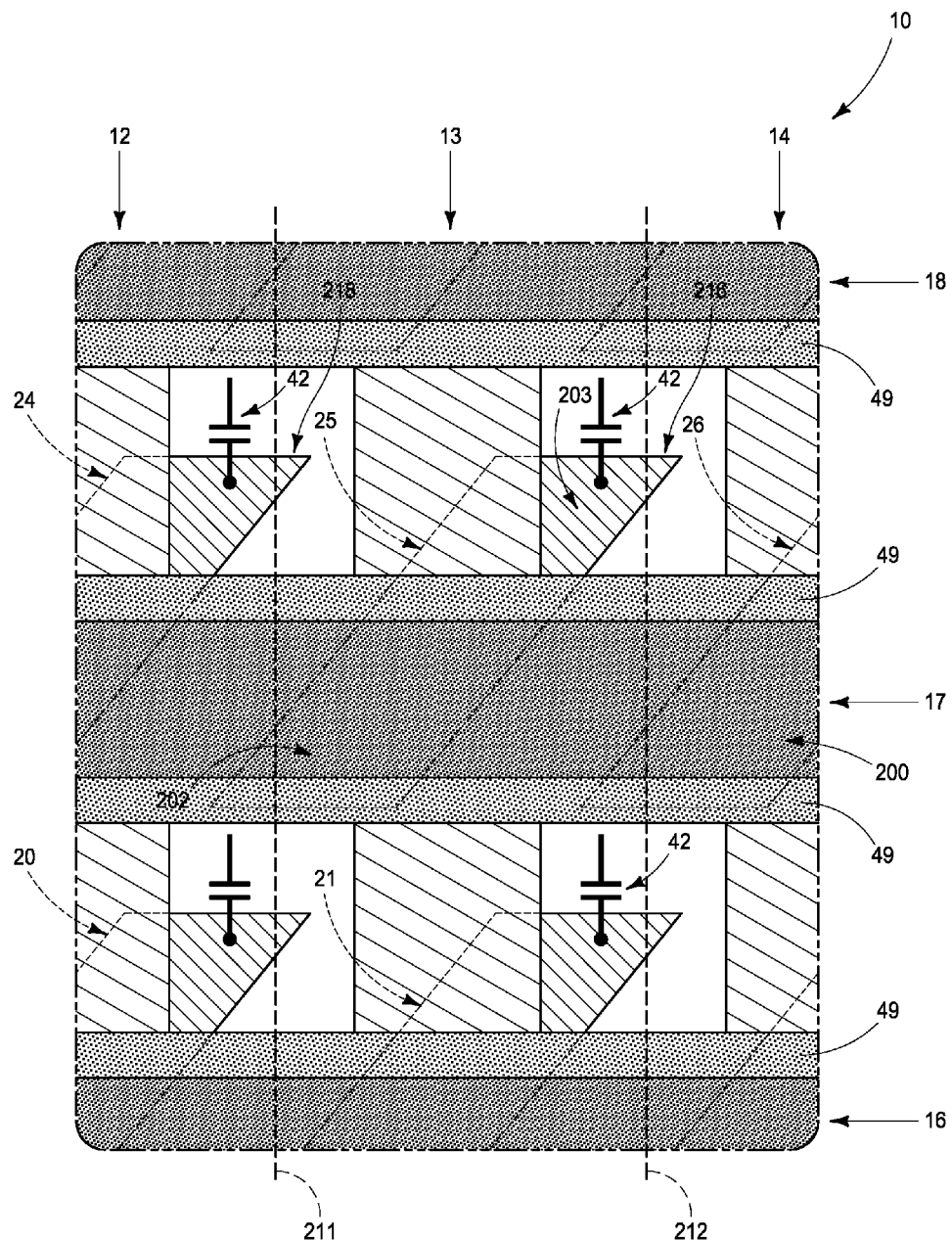
FIG. 3 illustrates an expanded region of the FIG. 1 layout.
Figure 4:
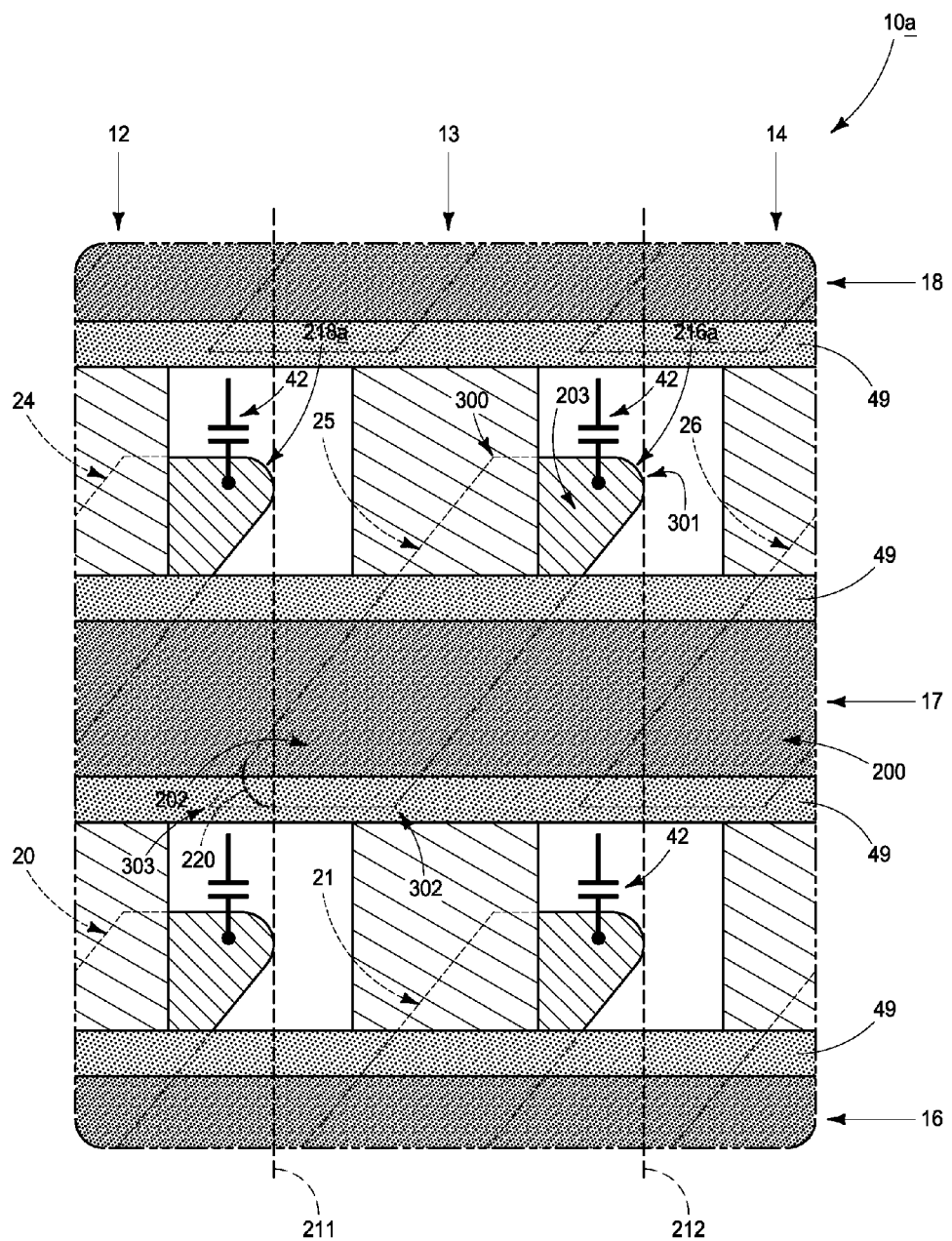
FIG. 4 shows a region analogous to that of FIG. 3 in accordance with another example embodiment.

FIG. 3 shows an expanded region of the layout 10 of FIG. 1, and illustrates an example embodiment configuration of cell active material structures (for instance, structures 24 and 25) relative to wordlines. A wordline passing through a cell active material structure may be considered to be a primary wordline relative to the cell active material structure. Accordingly, wordline 12 is a primary wordline for cell active material structure 24, and wordline 13 is a primary wordline for cell active material structure 25. (It is noted that the individual wordlines can be "primary" wordlines for more than one active area; and accordingly wordline 12 is a primary wordline for both of active material structures 20 and 24, while wordline 13 is a primary wordline for both of active material structures 21 and 25.)

Each of the cell active material structures may be considered to have a first side coupled to a bitline, and a second side coupled to a charge-storage device. For instance, cell active material structure 25 may be considered to have a first side 202 electrically coupled to bitline 17 and a second side 203 electrically coupled to a charge storage device 42.

In the shown embodiment, the second sides of the cell active material structures have regions closer to a wordline adjacent the primary wordline than to the primary wordline. Dashed lines 211 and 212 are provided to assist in illustrating this concept. Specifically, dashed line 211 is provided midway between wordlines 12 and 13, and dashed line 212 is provided midway between wordlines 13 and 14. The second side 203 of cell material active structure 25 comprises a region 216 which is closer to the wordline 14 than to the primary wordline 13; and similarly a second side of cell material active structure 24 comprises a region 218 which is closer to wordline 13 than to the primary wordline 12.

In some embodiments, the close proximity of regions of the second sides of the cell active material structures to wordlines adjacent the cell active material structures may be desirable in that it creates additional surface area of the cell active material structures for coupling with charge storage devices. In other embodiments, such close proximity may be problematic, in that it may lead to crosstalk between adjacent devices. If the close proximity is problematic, it may be alleviated utilizing an embodiment described with reference to FIG. 4. Specifically, the regions close to adjacent wordlines (illustrated as regions 216a and 218a) have rounded corners to thereby reduce proximity of such regions to adjacent wordlines. In some embodiments the corners along the first sides of the cell active material structures (for instance a corner along the first side 202 of structure 25) may also be rounded to reduce proximity relative to adjacent wordlines, as is diagrammatically illustrated by the dashed line 220. In some embodiments the cell active material structure 25 of FIG. 4 may be considered to have four corners 300, 301, 302 and 303. The corners 300 and 302 are overlapped by wordline 13 and are sharp corners, while the corner 301 is not overlapped by the wordline and is a rounded corner. The term "sharp" is utilized to distinguish the shape of corners 300 and 301 from the rounded shape of corner 301. The corner 303 may be sharp in some embodiments and rounded in others as discussed above and indicated with dashed line 220.

The structures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "electrically insulative" may both be utilized to describe materials having insulative electrical properties. Both terms are considered synonymous in this disclosure. The utilization of the term "dielectric" in some instances, and the term "electrically insulative" in other instances, may provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In some embodiments, a semiconductor construction comprises a semiconductor material having trenches extending therein, with the trenches being configured in a pattern of alternating deep trenches and shallow trenches. Electrically insulative material is within the deep trenches. First electrically conductive lines are within the shallow trenches and are spaced from the semiconductor material by gate dielectric material, with regions of the first electrically conductive lines within the shallow trenches being transistor gates. The semiconductor material comprises transistor active areas between the deep trenches and extending partially around the transistor gates. The transistor active areas comprise channel regions adjacent the transistor gates, and comprise paired source/drain regions that are on opposing sides of the channel regions from one another. The transistor active areas are trough-shaped along a cross-section and have the source/drain regions at upper surfaces of the trough-shapes. The transistor gates, channel regions and source/drain regions together comprise a plurality of transistors. None of the source/drain regions are shared by two different transistors.

In some embodiments, a DRAM array comprises wordlines extending along a first direction, with the wordlines comprising transistor gates passing through memory cells. Bitlines extend along a second direction which intersects the first direction. The memory cells comprise cell active areas at least partially surrounding the transistor gates. Each cell active area comprises a channel region adjacent the gate, and comprises first and second source/drain regions that are on opposing sides of the channel region from one another. Within each memory cell, the first source/drain region is electrically coupled with a bitline connection, and the second source/drain region is electrically coupled with a charge storage device. Each memory cell has a unique bitline connection.

In some embodiments, a DRAM array comprises a silicon-containing base having trenches extending therein, with the trenches being configured in a pattern of alternating deep trenches and shallow trenches. Electrically insulative material is within the deep trenches. Wordlines are within the shallow trenches and are spaced from the semiconductor material by gate dielectric material. Regions of the wordlines within the shallow trenches are transistor gates. The base comprises memory cell active areas between the deep trenches and which extend partially around the transistor gates. The memory cell active areas comprise channel regions adjacent the transistor gates, and comprise paired source/drain regions that are on opposing sides of the channel regions from one another. The memory cell active areas are trough-shaped along a cross-section and have conductively-doped regions at upper surfaces of the trough-shapes. The conductively-doped regions correspond to the source/drain regions. The transistor gates, channel regions and source/drain regions together comprise a plurality of transistors. None of the source/drain regions are shared by two different transistors. Capacitors are electrically coupled with one of the source/drain regions from each of the paired source/drain regions.

In some embodiments, a DRAM array layout comprises wordlines extending along a first direction, and comprises bitlines extending along a second direction that crosses the first direction. Cell active material structures are at intersections of the wordlines and bitlines. The cell active material structures are substantially parallelograms which have a first side coupled to a bitline, and which have a second side coupled to a capacitor. The second side is on an opposite side of a wordline passing through an individual cell active material structure relative to the first side. Each cell active material structure has a connection to a bitline which is not shared with any other cell active material structures.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A DRAM array layout, comprising:
   wordlines extending along a first direction;
   bitlines extending along a second direction that crosses the first direction;
   cell active material structures at intersections of the wordlines and bitlines, the cell active material structures being substantially parallelograms having a first side coupled to a bitline and a second side coupled to a charge storage device; the second side being on an opposite side of a wordline passing through an individual cell active material structure relative to the first side;
   each cell active material structure having a connection to a bitline which is not shared with any other cell active material structures;
   wherein the wordline passing through the individual cell active material structure is a primary wordline relative to the individual cell active material structure; wherein the second side of the individual cell active material structure comprises a region proximate a wordline adjacent the primary wordline; and
   each of the substantial parallelograms of the cell active material structures having four corners; two of said four corners being overlapped by the primary wordlines passing through the cell active material structures and being sharp corners; third corners of each of the substantial parallelograms of the cell active material structures being on the second sides of the cell active material structures and being rounded relative to said two of the four corners of each of the substantial parallelograms of the cell active material structures.

2. The DRAM array layout of claim 1 wherein fourth corners of said four corners of each of the substantial parallelograms of the cell active material structures are on the first sides of the cell active material structures and are rounded relative to said two of the four corners of each of the substantial parallelograms of the cell active material structures.

3. A DRAM array corresponding to the DRAM array layout of claim 1.

4. The DRAM array layout of claim 1 wherein the charge storage device is a capacitor.

5. The DRAM array layout of claim 1 wherein fourth corners of said four corners of each of the substantial parallelograms of the cell active material structures are on the first sides of the cell active material structures and are sharp corners.

* * * * *